United States Patent [19]

Masuko et al.

[11] Patent Number: 5,212,699

[45] Date of Patent: May 18, 1993

[54] TEMPERATURE-CONTROLLING LASER DIODE ASSEMBLY

[75] Inventors: Takayuki Masuko, Koganei; Shunichi Satoh, Kawasaki; Tetsuo Ishizaka, Narashino; Toshio Ohya, Zama, all of Japan

[73] Assignee: Fujitsu Limited, Kanagawa, Japan

[21] Appl. No.: 729,997

[22] Filed: Jul. 15, 1991

[30] Foreign Application Priority Data

Jul. 18, 1990 [JP] Japan .................. 2-187999

[51] Int. Cl.⁵ .................. H01S 3/04; H01S 3/045
[52] U.S. Cl. .................. 372/34; 372/50; 372/43; 257/678; 257/712
[58] Field of Search .................. 372/33–36, 372/43, 50; 357/74, 81

[56] References Cited

U.S. PATENT DOCUMENTS

| | | | |
|---|---|---|---|
| 4,399,541 | 8/1983 | Kovats et al. | 372/36 |
| 4,571,728 | 2/1986 | Yoshikawa | 372/36 |
| 4,792,957 | 12/1988 | Kollanyi | 372/34 |
| 4,803,689 | 2/1989 | Shibanuma | 372/36 |
| 5,068,865 | 11/1991 | Ohshima et al. | 372/36 |

FOREIGN PATENT DOCUMENTS

| | | |
|---|---|---|
| 0100086 | 2/1984 | European Pat. Off. . |
| 0326207 | 8/1989 | European Pat. Off. . |
| 54-94293 | 7/1979 | Japan . |
| 61-71689 | 4/1986 | Japan . |
| 1-245585 | 9/1989 | Japan . |
| 1-318275 | 12/1989 | Japan . |

OTHER PUBLICATIONS

English Abstract for Japanese Patent Publication 59-23583(A), Feb. 7, 1984.
European Search Report for EP91 11 2022, The Hague, Feb. 7, 1992.

Primary Examiner—Akm E. Ullah
Attorney, Agent, or Firm—Staas & Halsey

[57] ABSTRACT

A laser diode assembly capable of controlling a temperature of a laser diode chip with a high accuracy. A Peltier device is mounted on a base member, and a carrier is mounted on the Peltier device. On the carrier are mounted the laser diode chip, a thermistor, and a relay block. A terminal for connecting the thermistor to an external circuit is provided so as to extend through the base member. The thermistor and the relay block are connected together by wire bonding, and the relay block and the terminal are also connected together by wire bonding. The laser diode assembly further includes a control circuit for controlling a driving current for the Peltier device contacting with the carrier so as to maintain a resistance of the thermistor fixed on the carrier at a constant value.

13 Claims, 7 Drawing Sheets

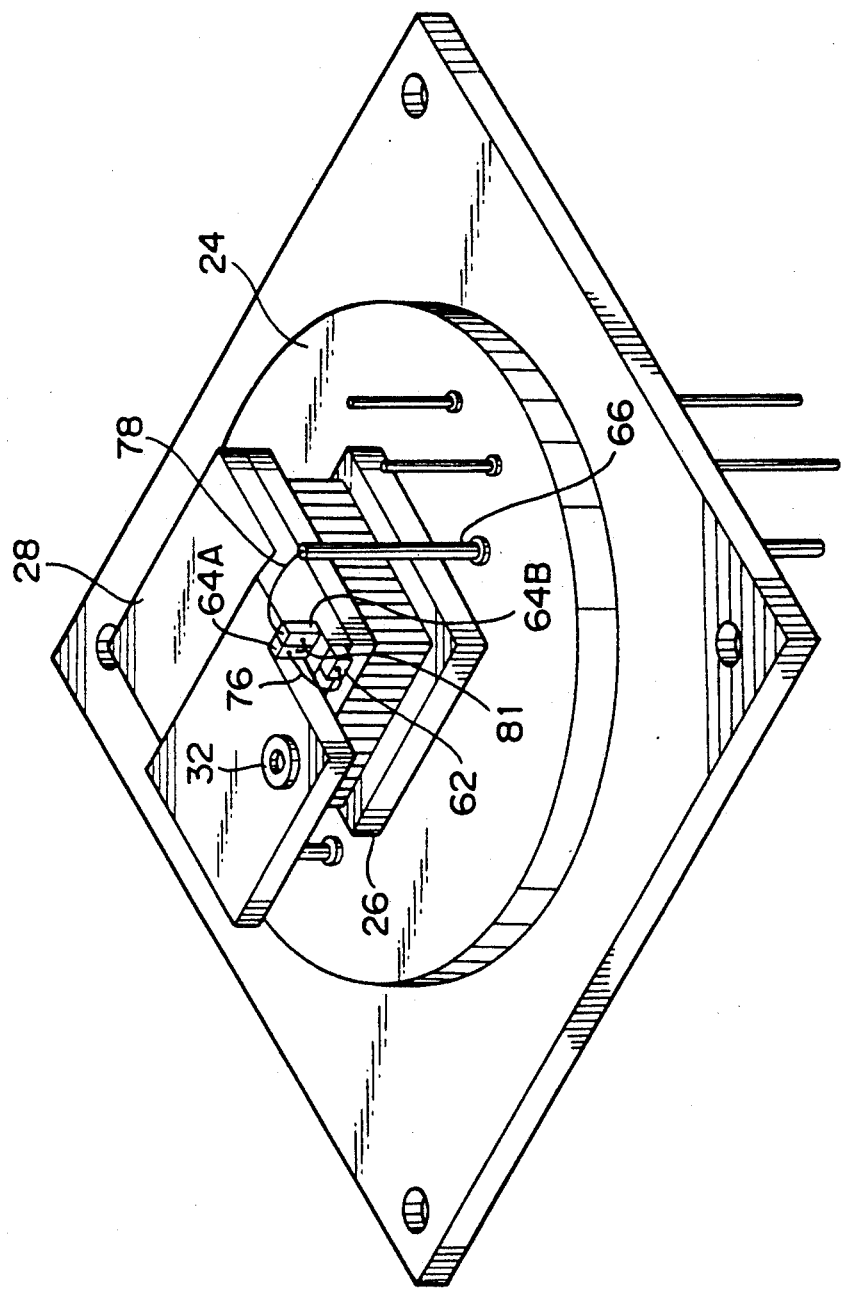

TEMPERATURE-CONTROLLING LASER DIODE ASSEMBLY

FIELD OF THE INVENTION

The present invention relates generally to a laser diode assembly, and more particularly to a laser diode assembly including a laser diode adapted to be controlled to a constant temperature by driving a Peltier device.

BACKGROUND OF THE INVENTION

In a general optical communication system using an intensity modulation/direct detection system, generally an output light power of a laser diode (semiconductor laser) changes with a current injected into the laser diode, so that an intensity modulated light is obtained by applying a modulated current pulse to the laser diode current-biased in the vicinity of an oscillation threshold value. Meanwhile, an I-L characteristic (i.e., a characteristic indicative of a relation between an injected current and an output light power) changes with temperature. Accordingly, in order to obtain a constant operating condition irrespective of an external temperature, it is necessary to drive the laser diode controlled to a constant temperature or carry out temperature compensation.

However, taking into consideration the fact that a change in I-L characteristic depending upon temperature cannot be easily specified, it is parctically difficult to carry out precise temperature compensation. Furthermore, it is not desirable from a viewpoint of deterioration of the laser diode to carry out temperature compensation only. Accordingly, precise temperature control of the laser diode is necessary in order to improve a reliability of the laser diode and eliminate a temperature compensating circuit.

Referring to FIG. 1, there is shown a conventional laser diode assembly including a laser diode chip 5 adapted to be controlled to a constant temperature by driving a Peltier device 3. The Peltier device 3 is mounted on a metal stem 2. The Peltier device 3 is provided to utilize a Peltier effect for cooling or the like such that flow of electric current through a contact point between different kinds of semiconductors causes generation or absorption of heat other than Joule heat at this contact point. A metal carrier 4 is mounted on the Peltier device 3, and the laser diode chip (which will be hereinafter referred to as LD chip) 5 and a thermistor 6 are mounted on the carrier 4.

The stem 2 is provided with a terminal 7 for connecting the thermistor 6 to an external circuit, a terminal 8 for connecting the Peltier device 3 to a driving circuit therefor, and a terminal 9 for connecting the LD chip 5 to a driving circuit therefor. These terminals 7, 8 and 9 extend through the stem 2. A common earth terminal 10 is connected to the stem 2. In this conventional laser diode assembly (which will be hereinafter referred to as LD assembly), a resistance of the thermistor 6 fixed on the carrier 4 is detected, and a driving current for the Peltier device 3 is so controlled as to maintain the resistance at a constant value. Accordingly, a heat quantity to be discharged from the LD chip 5 through the Peltier device 3 to the outside of the LD assembly is controlled to maintain a temperature of the LD chip 5 at a constant value. A cap 11 having a window 12 is tightly fixed to the stem 2 to sealingly enclose the inside of the LD assembly.

In the conventional LD assembly shown in FIG. 1, the terminal 7 and the thermistor 6 are connected together normally by a bonding wire 7a formed of gold having a good heat conductivity. As a result, in the case that an internal temperature of the LD assembly is different from an external temperature of the LD assembly, heat flows from the outside of the LD assembly through the terminal 7 and the bonding wire 7a into the thermistor 6, or heat flows from the thermistor 6 through the bonding wire 7a and the terminal 7 to the outside of the LD assembly, resulting in a problem that high-precision temperature control of the LD chip 5 cannot be carried out.

Referring to FIG. 2, reference numeral 13 designates the I-L characteristic in the case that the internal temperature of the LD assembly is equal to the external temperature of the LD assembly, wherein $I_{th}$ represents an oscillation threshold value of current. When the external temperature of the LD assembly becomes relatively high, heat flows from the outside of the LD assembly through the terminal 7 and the bonding wire 7a into the thermistor 6, so that a temperature of the thermistor 6 becomes higher than a temperature of the carrier 4 and the LD chip 5. Therefore, the temperature of the LD chip 5 is controlled to be lower than a desired temperature, and the I-L characteristic is shifted to the left as shown by reference numeral 14 in FIG. 2, resulting in a decrease in $I_{th}$.

On the other hand, when the external temperature of the LD assembly becomes relatively low, heat flows out of the thermistor 6 through the bonding wire 7a and the terminal 7 to the outside of the LD assembly, so that the temperature of the thermistor 6 becomes lower than the temperature of the LD chip 5 and the carrier 4. Therefore, the temperature of the LD chip 5 is controlled to be higher than the desired temperature, and the I-L characteristic is shifted to the right as shown by reference numeral 15 in FIG. 2, resulting in an increase in $I_{th}$. Such a change in $I_{th}$ due to a change in the external temperature is 2-3 mA, which is not ignorable in the case that the LD assembly is applied to an optical communication system of high speeds, e.g., about 1.8 Gb/s.

SUMMARY OF THE INVENTION

It is therefore an object of the present invention to provide a laser diode assembly which can eliminate the above-mentioned problem in the prior art and control a temperature of the laser diode chip with a high accuracy.

In accordance with an aspect of the present invention, there is provided a laser diode assembly comprising a base member; a Peltier device mounted on said base member; a carrier mounted on said Peltier device; a laser diode chip fixedly mounted on said carrier; a thermistor fixedly mounted on said carrier; a terminal extended through said base member for connecting said thermistor to an external circuit; a relay block provided between said thermistor and said terminal; first connecting means for connecting said thermistor to said relay block; second connecting means for connecting said relay block to said terminal; a cap fixed to said base member for sealingly enclosing said Peltier device, said carrier, said laser diode chip, said thermistor, and said relay block; and means for detecting a resistance of said thermistor and controlling a driving current for said Peltier device contacting with said carrier so as to maintain said resistance at a constant value.

With this arrangement according to the present invention, the relay block is provided between the thermistor and the terminal, and the thermistor and the terminal are connected together through the relay block by wire bonding. Accordingly, in the case that an internal temperature of the laser diode assembly is different from an external temperature of the laser diode assembly, the flow of heat into or out of the thermistor through a bonding wire and the terminal is hardly generated. As a result, the thermistor is maintained at substantially the same temperature as that of the laser diode chip and the carrier, thereby realizing high-precision temperature control of the laser diode chip.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 8 is a perspective view of the LD assembly with the cap removed according to a fourth preferred embodiment of the present invention.

DESCRIPTION OF THE PREFERRED EMBODIMENTS

Figure 1:
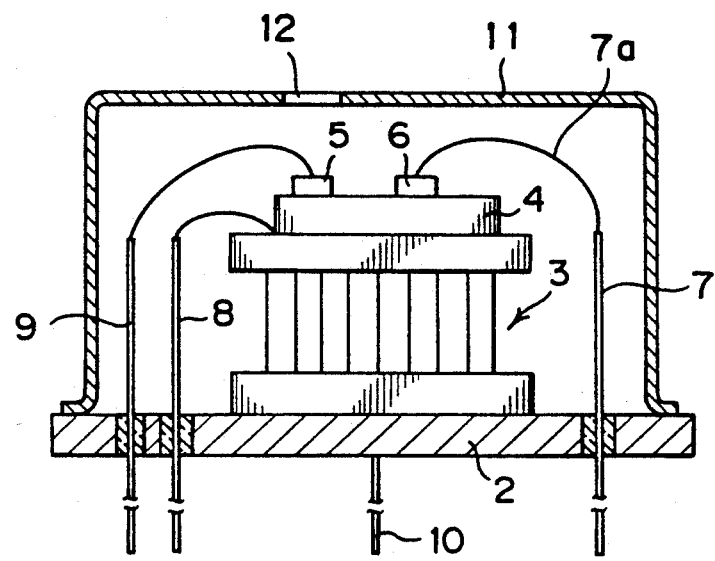
FIG. 1 is a sectional view of a conventional LD assembly.
Figure 2:
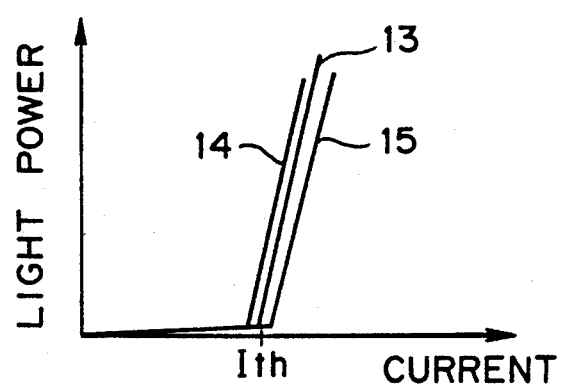
FIG. 2 is a diagram illustrating a manner of change in I-L characteristic depending upon an external temperature of the LD assembly.
Figure 3:
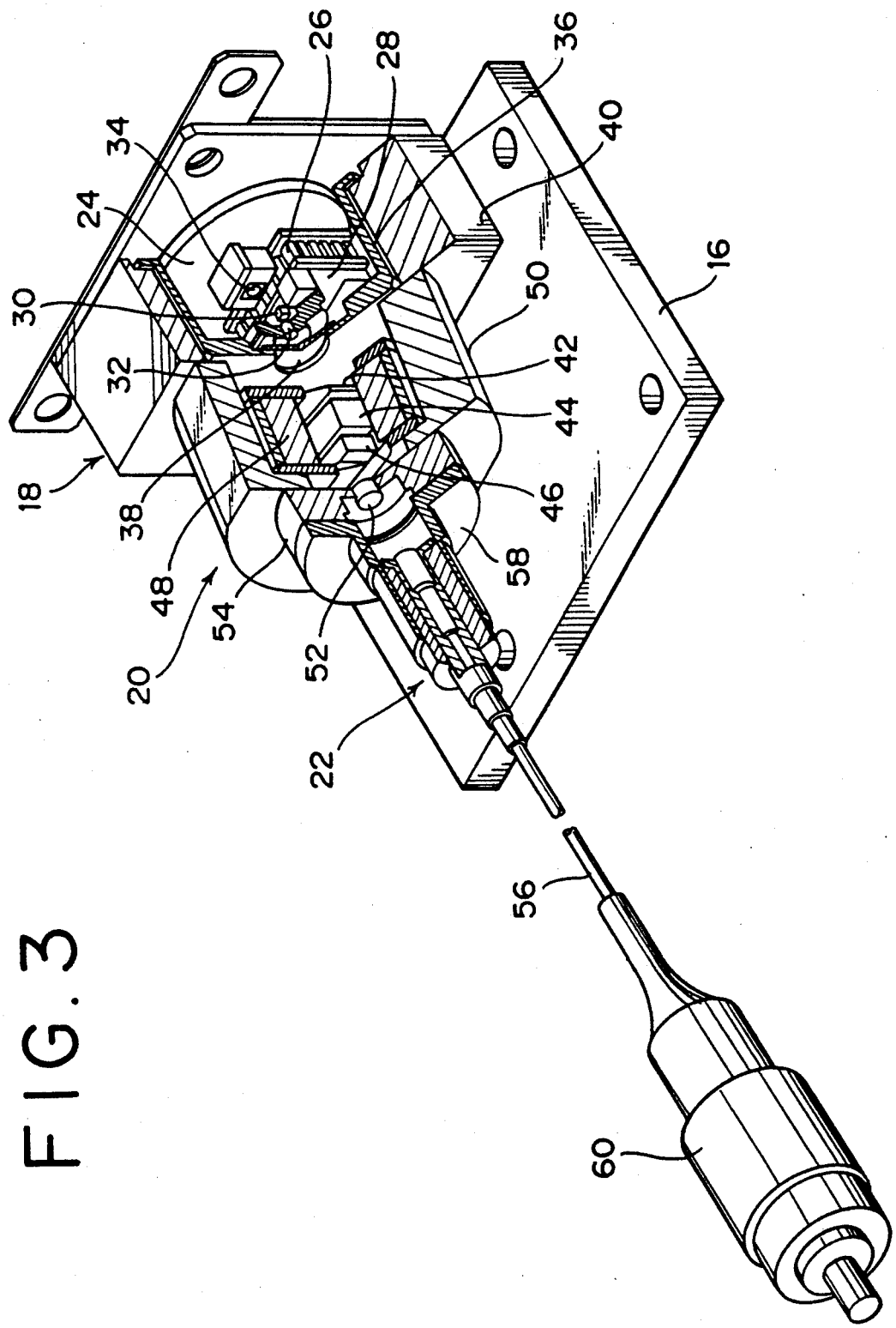
FIG. 3 is a partially cut-away perspective view of a laser diode module incorporating the LD assembly of the present invention.

With reference to FIG. 3, there will now be described a laser diode module (which will be hereinafter referred to as LD module) to which the present invention is suitably applied. The laser diode module is constructed by integrating a laser diode assembly (which will be hereinafter referred to as LD assembly) 18 fixed on a base 16, an optical isolator 20, and a fiber assembly 22.

The LD assembly 18 includes a Peltier device 26 mounted on a metal stem 24. A metal carrier 28 having a good heat conductivity is mounted on the Peltier device 26. On the carrier 28 are fixedly mounted a laser diode chip (which will be hereinafter referred to as LD chip) 30, a thermistor, and a relay block both not shown in FIG. 3 but will be described with reference to FIG. 4.

A lens 32 for generally collimating light forwardly emitted from the LD chip 30 is fixed to the carrier 28. A photodiode 34 for detecting light backwardly emitted from the LD chip 30 is mounted on the stem 24. A cap 36 having a window 38 for transmitting the light forwardly emitted from the LD chip 30 is fixed to the stem 24 so as to sealingly enclose the inside of the LD assembly 18. The LD assembly 18 sealingly enclosed by the cap 36 and the stem 24 is accommodated in a frame 40.

The optical isolator 20 includes a prism 42 formed of a birefringent crystal such as rutile, a Faraday rotator 44 formed of a magento-optical crystal such as YIG (yttrium-iron-garnet), a prism 46 similar to the prism 42, and an annular permanent magnet 48 provided around the prisms 42 and 46 and the Faraday rotator 44 for applying a predetermined magnetic field to the Faraday rotator 44 in an advancing direction of the light. The prisms 42 and 46, the Faraday rotator 44, and the permanent magnet 48 are fixed in a frame 50 by a suitable means.

The fiber assembly 22 is constructed by integrating a lens holder 54 for holding a lens 52 and a fiber holder 58 for holding an optical fiber 56. An optical connector 60 is fixed to one end of the optical fiber 56.

The light emitted through the window 38 of the LD assembly 18 is transmitted through the optical isolator 20 with a high transmittance in a forward direction, and is introduced into the optical fiber 56. Then, the light is transmitted through the optical fiber 56 to a receiving section. On the other hand, a reflected return light undesirably generated on one end surface or the like of the optical fiber in the optical connector 60 is eliminated by the optical isolator 20 with a high attenuation factor, and it is hardly returned to the LD assembly 18. Accordingly, it is possible to maintain a stable operation of the LD chip 30 and directly drive the LD chip 30 for modulation.

Figure 4:
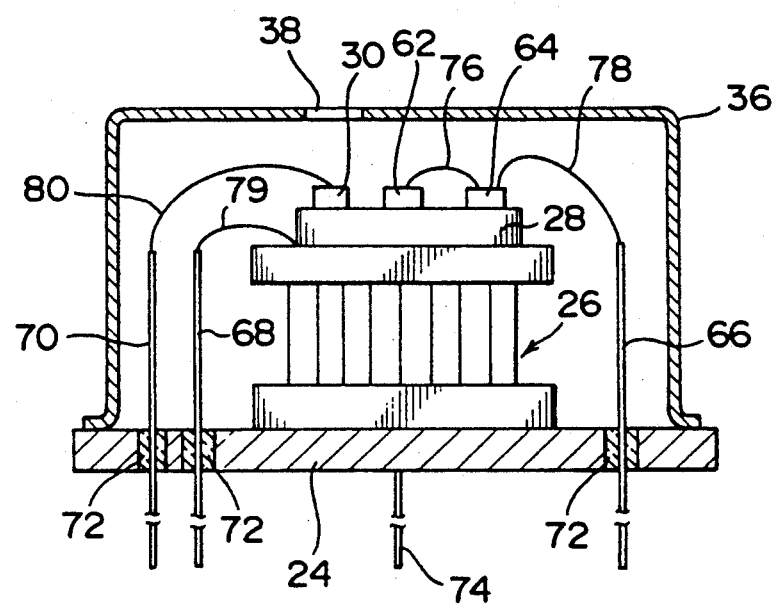
FIG. 4 is a sectional view of the LD assembly according to a first preferred embodiment of the present invention.
Figure 5:
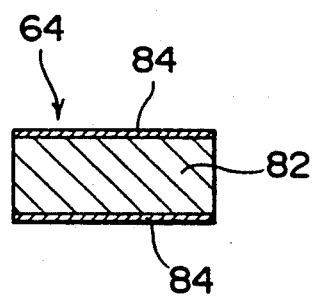
FIG. 5 is a sectional view of the relay block suitably employed in the first preferred embodiment.

With reference to FIG. 4, there will now be described a construction of the LD assembly according to a first preferred embodiment of the present invention with reference to FIG. 4. On the carrier 28 are fixedly mounted the LD chip 30, a thermistor 62, and a relay block 64. As shown in FIG. 5, the relay block 64 is constructed of a block body 82 formed of an electrical insulator having a good heat conductivity and a metal film 84 formed on upper and lower surfaces of the block body 82. The block body 82 is preferably formed of beryllia. Beryllia has a good workability, and it makes easy the formation of the metal film 84 on the block body 82. An optimum material for the metal film 84 to be formed on the block body 82 is gold in consideration of easy fixation of the relay block 64 itself to the carrier 28 and easy wire bonding onto the relay block 64.

The stem 24 is provided with a terminal 66 for connecting the thermistor 62 to an external circuit provided outside the LD assembly 18, a terminal 68 for connecting the Peltier device 26 to a driving circuit provided outside the LD assembly 18, and a terminal 70 for connecting the LD chip 30 to a driving circuit provided outside the LD assembly 18. These terminals 66, 68 and 70 extend through the stem 24, and they are electrically insulated from the metal stem 24 by glass hermetic seals 72. Further, a common earth terminal 74 is connected to the stem 24. The thermistor 62 and the relay block 64 are connected together by a bonding wire 76, and the relay block 64 and the terminal 66 are connected together by a bonding wire 78. Further, the Peltier device 26 and the terminal 68 are connected together by a bonding wire 79, and the LD chip 30 and the terminal 70 are connected together by a bonding wire 80.

The reason why the relay block 64 directly fixed on the carrier 28 is formed of a material having a good heat conductivity is to let heat having flown through the terminal 66 and the bonding wire 78 into the relay block 64 be absorbed by the Peltier device 26 (provided that an external temperature is relatively high), thereby preventing the heat having flown into the relay block 64 from flowing through the bonding wire 76 into the thermistor 62. Accordingly, the first preferred embodiment is suitable in the case that a fixed position of the thermistor 62 on the carrier 28 is relatively spaced apart from a fixed position of the relay block 64 on the carrier 28, and that the Peltier device 26 has a relatively large capacity.

In a second preferred embodiment of the present invention, the relay block 64 is constructed of a block body 82 formed of a heat insulating material and a metal film 84 formed on upper and lower surfaces of the block body 82. The relay block 64 is directly fixed to the stem 24 or the cap 36 so as not to contact the carrier 28. The block body 82 is preferably formed of alumina. The metal film 84 is optimally formed of gold similarly to the first preferred embodiment.

The reason why the block body 82 of the relay block 64 is formed of a heat insulating material is as follows:

That is, in the case that the relay block 64 is directly fixed to the stem 24 or the cap 36 which is not controlled in temperature, there is a possibility of heat flowing between the thermistor 62 and the outside of the LD assembly 18 through the relay block 64, so that the problem in the prior art cannot completely solved. Therefore, by employing the block body 82 of a heat insulating material, the above-mentioned flow of the heat is intended to be minimized.

Figure 6:
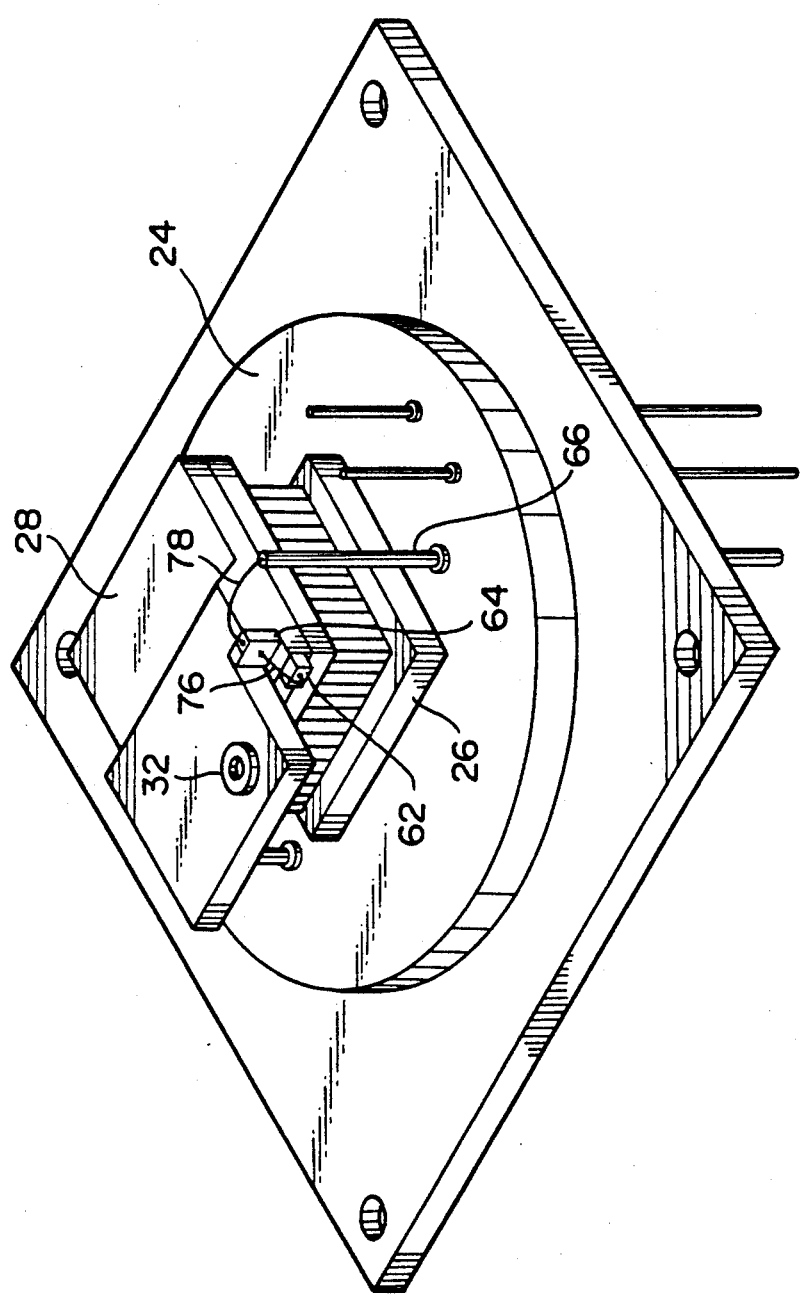
FIG. 6 is a perspective view of the LD assembly with the cap removed according to a third preferred embodiment of the present invention.

There will now be described a construction of the LD assembly according to a third preferred embodiment of the present invention with reference to FIGS. 6, 7A and 7B. As shown in FIG. 6, the thermistor 62 and the relay block 64 are fixed to a side surface of the carrier 28. Further, although especially not shown, the LD chip 30 is also fixed to the side surface of the carrier 28 at a position below the lens 32.

Figure 7A:
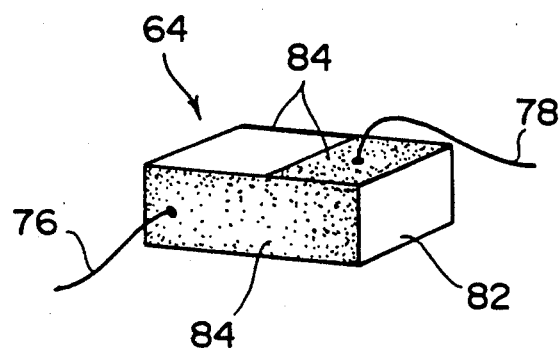
FIG. 7A is a perspective view of the relay block suitably employed in the third preferred embodiment.

As shown in FIG. 7A, the relay block 64 is constructed of a block body 82 formed of a heat insulating material such as alumina, which is in the form of a rectangular parallelepiped, and a metal film 84 such as a gold film formed on the block body 82. The metal film 84 is formed on a surface of the block body 82 where the thermistor 62 and the terminal 66 are to be connected together by wire bonding, and the metal film 84 is also formed on another surface of the block body 82 where the relay block 64 is to be fixed to the carrier 28. In this preferred embodiment, taking into consideration that the thermistor 62 is fixed to the side surface of the carrier 28, connection points of the bonding wires 76 and 78 to the relay block 64 are located on different surfaces of the relay block 64, so as to make a wire bonding work easy.

The reason why the relay block 64 is in contact with the carrier 28 in this preferred embodiment is to maintain the relay block 64 and the bonding wire 76 at the same temperature as that of the carrier 28 and the thermistor 62, thereby greatly suppressing the flow of heat through the bonding wire 76 into the thermistor 62 or the flow of heat out of the thermistor 62 through the bonding wire 76. Further, the reason why the block body 82 of the relay block 64 is formed of a heat insulating material is to prevent the flow of heat between the carrier 28 and the outside of the LD assembly 18 and between the Peltier device 26 and the outside of the LD assembly 18 through the terminal 66 and the bonding wire 78. Accordingly, this preferred embodiment is especially suitable in the case that the carrier 28 and/or the Peltier device 26 has a small heat capacity.

In the case that a temperature of the outside of the LD assembly 18 is relatively high in the third preferred embodiment, there is a possibility that the heat having flown through the terminal 66 and the bonding wire 78 into the relay block 64 will flow through the metal film 84 of the relay block 64 to the bonding wire 76, causing a difficulty of accurate temperature detection by the thermistor 62. Accordingly, it is preferable that a connection point of the bonding wire 76 on the metal film 84 is spaced apart from a connection point of the bonding wire 78 on the metal film 84 as far as possible. It was proved by experiments that the flow of the heat through the metal film 84 into the bonding wire 76 can be almost suppressed by setting a distance between the connection point of the bonding wire 76 on the metal film 84 and the connection point of the bonding wire 78 on the metal film 84 to 5 mm or more. Accordingly, it is preferable that the distance between the above two connection points is 5 mm or more.

Figure 7B:
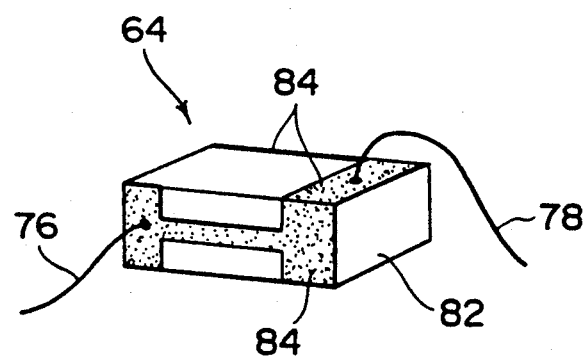
FIG. 7B is a view similar to FIG. 7A, showing a modification of the relay block suitably employed in the third preferred embodiment.

FIG. 7B shows a modification of the relay block 64 to be employed in the third preferred embodiment for the purpose of minimizing the flow of the heat through the metal film 84 into or out of the thermistor 62. That is, the metal film 84 of the relay block 64 shown in FIG. 7B is relatively narrowed at a portion between the connection point of the bonding wire 76 on the metal film 84 and the connection point of the bonding wire 78 on the metal film 84. By reducing a width of the metal film 84 in this manner, a sectional area of the metal film 84 contributing to the flow of the heat through the metal film 84 into or out of the thermistor 62 is reduced to thereby minimize the flow of the heat through the metal film 84.

There will now be described a construction of the LD assembly 18 according to a fourth preferred embodiment of the present invention with reference to FIGS. 8, 9A and 9B. As shown in FIG. 8, two relay blocks 64A and 64B are fixed to the side surface of the carrier 28, and they are connected together by a bonding wire 81. The other construction in this preferred embodiment is the same as that in the third preferred embodiment shown in FIG. 6.

Figure 9A:
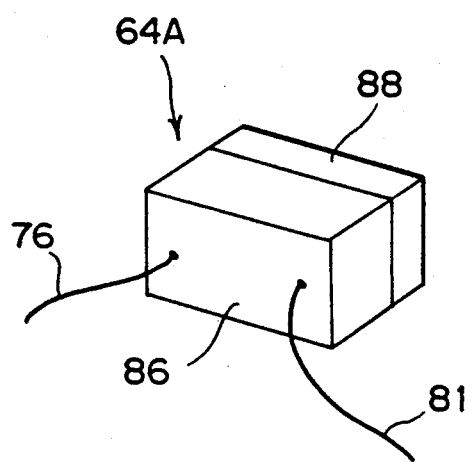
FIGS. 9A and 9B are perspective views of different block members constituting the relay block suitably employed in the fourth preferred embodiment.
Figure 9B:
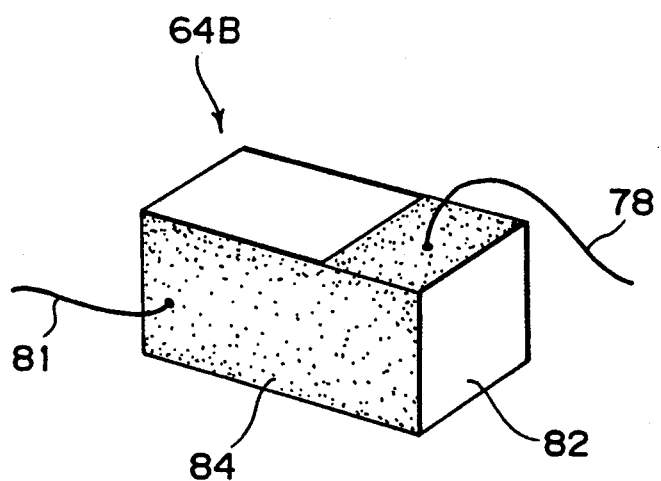

As shown in FIG. 9A, the relay block 64A to be connected through the bonding wire 76 to the thermistor 62 is constructed of a metal body 86 having a good heat conductivity and an electrical insulator body 88 having a good heat conductivity. The metal body 86 is preferably formed of copper with a deposited gold film. A surface of the electrical insulator body 88 on the opposite side of the metal body 86 is deposited with gold for the purpose of fixing the relay block 64A to the carrier 28. The electrical insulator body 88 having a good heat conductivity is preferably formed of beryllia. On the other hand, as shown in FIG. 9B, the relay block 64B to be connected through the bonding wire 78 to the terminal 66 is constructed of a block body 82 formed of a heat insulating material and a metal film 84 formed on the block body 82. The block body 82 is preferably formed of alumina. The relay blocks 64A and 64B are connected together by the bonding wire 81.

By employing such plural relay blocks as in the fourth preferred embodiment, the flow of heat into the thermistor 62 or the flow of heat out of the thermistor 62 can be prevented very satisfactorily. Further, as the relay block 64A located in the proximity of the thermistor 62 is formed of a material having a good heat conductivity, a temperature of the thermistor 62 can be made substantially completely accord with a temperature of the carrier 28, thereby improving an accuracy of temperature control. Further, as the relay block 64B located in the proximity of the terminal 66 is primarily formed of a heat insulating material, the flow of heat into or out of the thermistor 62 can be effectively suppressed even when a temperature of the inside of the LD assembly 18 is remarkably different from a temperature of the outside of the LD assembly 18.

While the two relay blocks 64A and 64B are fixed to the side surface of the carrier 28 in the fourth preferred embodiment shown in FIG. 8, three or more relay blocks may be fixed to the carrier 28, and the thermistor 62 and the terminal 66 may be connected together by wire bonding through these relay blocks. In this case, the relay block located nearest to the thermistor 62 is formed from a composite body composed of a metal body and an electrical insulator body both having a good heat conductivity, while the relay block located nearest to the terminal 66 is constructed of a block body formed of a heat insulating material and a metal film formed on the block body. With this construction, substantially the same effect as that in the fourth preferred embodiment can be obtained.

According to the present invention as mentioned above, it is possible to greatly prevent the flow of heat out of the thermistor through the terminal and the bonding wire to the outside of the LD assembly or the flow of heat from the outside of the LD assembly through the terminal and the bonding wire into the thermistor. Accordingly, the temperature of the thermistor will vary with the temperature of the LD chip, with the result that high-precision temperature control of the LD chip can be realized.

What is claimed is:

1. A laser diode assembly, comprising:
   a base member;
   a Peltier device mounted on said base member;
   a carrier mounted on said Peltier device;
   a laser diode chip fixedly mounted on said carrier;
   a thermistor fixedly mounted on said carrier;
   a terminal extended through said base member for connecting said thermistor to an external circuit;
   a relay block provided between said thermistor and said terminal, said relay block comprising a block body formed of a heat insulating material and a metal film formed on said block body, said relay block being spaced from said carrier;
   first connecting means for connecting said thermistor to said relay block;
   second connecting means for connecting said relay block to said terminal;
   a cap fixed to said base member for sealingly enclosing said Peltier device, said carrier, said laser diode chip, said thermistor, and said relay block; and
   means for detecting a resistance of said thermistor and controlling a driving current for said Peltier device contacting with said carrier to maintain said resistance at a constant value.

2. The laser diode assembly as defined in claim 1, wherein said block body is formed of alumina.

3. A laser diode assembly, comprising:
   a base member;
   a Peltier device mounted on said base member;
   a carrier mounted on said Peltier device;
   a laser diode chip fixedly mounted on said carrier;
   a thermistor fixedly mounted on said carrier;
   a terminal extended through said base member for connecting said thermistor to an external circuit;
   a relay block provided between said thermistor and said terminal, said relay block comprising a block body formed of an electrical insulator having good heat conductivity and a metal film formed on said relay block, said relay block being in contact with said carrier;
   first connecting means for connecting said thermistor to said relay block;
   second connecting means for connecting said relay block to said terminal;
   a cap fixed to said base member for sealingly enclosing said Peltier device, said carrier, said laser diode chip, said thermistor, and said relay block; and
   means for detecting a resistance of said thermistor and controlling a driving current for said Peltier device contacting with said carrier to maintain said resistance at a constant value.

4. The laser diode assembly as defined in claim 3, wherein said block body is formed of beryllia.

5. A laser diode assembly, comprising:
   a base member;
   a Peltier device mounted on said base member;
   a carrier mounted on said Peltier device;
   a laser diode chip fixedly mounted on said carrier;
   a thermistor fixedly mounted on said carrier;
   a terminal extended through said base member for connecting said thermistor to an external circuit;
   a relay block provided between said thermistor and said terminal, said relay block comprising a block body formed of a heat insulating material and a metal film formed on said block body, said relay block being in contact with said carrier;
   first connecting means for connecting said thermistor to said relay block;
   second connecting means for connecting said relay block to said terminal;
   a cap fixed to said base member for sealingly enclosing said Peltier device, said carrier, said laser diode chip, said thermistor, and said relay block; and
   means for detecting a resistance of said thermistor and controlling a driving current for said Peltier device contacting with said carrier to maintain said resistance at a constant value.

6. The laser diode assembly as defined in claim 5, wherein said first and second connecting means are first and second bonding wires, respectively, and a distance between a first connection point of said first bonding wire on said metal film and a second connection point of said second bonding wire on said metal film is set to 5 mm or more.

7. The laser diode assembly as defined in claim 6, wherein a portion of said metal film between said first connection point and said second connection point is relatively narrowed.

8. The laser diode assembly as defined in claim 5, wherein said block body is formed of alumina.

9. A laser diode assembly, comprising:
   a base member;

a Peltier device mounted on said base member;
a carrier mounted on said Peltier device;
a laser diode chip fixedly mounted on said carrier;
a thermistor fixedly mounted on said carrier;
a terminal extended through said base member for connecting said thermistor to an external circuit;
a relay block provided between said thermistor and said terminal, said relay block comprising a plurality of blocks provided in contact with said carrier, said blocks being connected together by wire bonding;
first connecting means for connecting said thermistor to said relay block;
second connecting means for connecting said relay block to said terminal;
a cap fixed to said base member for sealingly enclosing said Peltier device, said carrier, said laser diode chip, said thermistor, and said relay block; and
means for detecting a resistance of said thermistor and controlling a driving current for said Peltier device contacting with said carrier to maintain said resistance at a constant value.

10. The laser diode assembly as defined in claim 9, wherein one of said blocks nearest to said thermistor comprises a composite body composed of a metal body having a good heat conductivity and an electrical insulator body having a good heat conductivity.

11. The laser diode assembly as defined in claim 10, wherein said metal body is formed of copper, and said electrical insulator body is formed of beryllia.

12. The laser diode assembly as defined in claim 9, wherein one of said blocks nearest to said terminal comprises a block body formed of a heat insulating material and a metal film formed on said block body.

13. The laser diode assembly as defined in claim 12, wherein said block body is formed of alumina.

* * * * *